United States Patent [19]

Farid et al.

[11] Patent Number: 4,743,530

[45] Date of Patent: May 10, 1988

[54] NEGATIVE WORKING PHOTORESISTS RESPONSIVE TO LONGER WAVELENGTHS AND NOVEL COATED ARTICLES

[75] Inventors: Samir Y. Farid, Rochester; Neil F. Haley, Fairport; Roger E. Moody; Donald P. Specht, both of Rochester, all of N.Y.

[73] Assignee: Eastman Kodak Company, Rochester, N.Y.

[21] Appl. No.: 933,660

[22] Filed: Nov. 21, 1986

[51] Int. Cl.[4] ............................................. G03C 1/76
[52] U.S. Cl. ................................... 430/281; 430/286; 430/914; 430/920; 522/25
[58] Field of Search ............... 430/920, 914, 281, 286, 430/287, 271; 522/25

[56] References Cited

U.S. PATENT DOCUMENTS

Re. 27,922  2/1974  Heseltine et al. ..................... 96/35.1
Re. 27,925  2/1974  Jenkins et al. ....................... 96/35.1

FOREIGN PATENT DOCUMENTS 2083832A  9/1981  United Kingdom ................ 430/920

OTHER PUBLICATIONS

*Research Disclosure,* vol. 200, Dec. 1980, Item 20036.
Specht, Martic, and Farid, "A New Class of Triplet Sensitizers", *Tetrahedron,* vol. 38, pp. 1203–1211, 1982.

*Primary Examiner*—Jack P. Brammer
*Attorney, Agent, or Firm*—Carl O. Thomas

[57] ABSTRACT

A negative working photoresist is disclosed responsive to imaging radiation of a wavelength longer than 550 nm comprised of an organic film forming component containing ethylenic unsaturation and capable of selective immobilization by addition at the site of ethylenic unsaturation and activator and photosensitizer coinitiators for ethylenic addition. The activator is an azinium salt activator, and the photosensitizer is a dye having its principal absorption peak at a wavelength longer than 550 nm and having a reduction potential which in relation to that of said azinium salt activator is at most 0.1 volt more positive.

25 Claims, No Drawings

NEGATIVE WORKING PHOTORESISTS RESPONSIVE TO LONGER WAVELENGTHS AND NOVEL COATED ARTICLES

FIELD OF THE INVENTION

This invention relates to photography. More specifically, this invention relates to novel photoresist compositions and to novel coated articles produced by said photoresist compositions.

BACKGROUND OF THE INVENTION

Commercially available compositions serving a variety of industrial needs for creating image patterns have become recognized as a distinct class of materials, referred to as photoresists. Photoresists are coated or otherwise spatially positioned, imagewise exposed to actinic radiation, and developed to leave the photoresist selectively in either exposed or unexposed areas. The name "photoresist" originated from the use of material remaining after imaging and development to resist etching and thereby define an etching pattern. However, today photoresists are employed for many divergent applications, including the formation of totally exposed layers, such as planarizing layers, and producing colored images.

Negative working photoresists are those which upon development are retained in areas exposed to actinic radiation. Negative working photoresists characteristically include an organic film forming component exhibiting ethylenic (vinyl) unsaturation. The film forming component is rendered immobile on development by undergoing photoinduced addition reactions at the ethylenic unsaturation sites.

The film forming components containing ethylenic unsaturation generally exhibit limited direct response to imaging radiation and therefore rely on one or more initiators for the ethylenic addition reaction. Heseltine et al and Jenkins et al U.S. Pat. Nos. Re. 27,922 and Re. 27,925 disclose N-oxyazinium initiators for photocrosslinking and photopolymerization, respectively.

It is common practice in preparing photoresist compositions to employ coinitiators. One of the coinitiators is a photosensitizer. Photosensitizers are relied upon to capture photons of exposing radiation. The remaining coinitiator is referred to as an activator. The activator is not relied upon to respond directly to exposing radiation, but rather adjacent activator and photosensitizer molecules react, following excitation of the latter by photon capture, causing release of a free radical. Released free radicals induce immobilizing addition reactions at sites of ethylenic unsaturation.

Photoresists are most commonly imagewise exposed at ultraviolet wavelengths. The necessity of using shorter imaging wavelengths places constraints on the master or pattern employing for imaging. For example, a master which presents a visible dye image, but exhibits little variance in ultraviolet transmittance is not well suited for imagewise exposing an ultraviolet responsive photoresist.

There are several difficulties in attempting to formulate photoresists which respond to wavelengths longer than 550 nm. For example, the energy contained in light photons declines as the wavelength of the radiation increases. This places increased demands on any photosensitizer coinitiator intended to adsorb in longer wavelength regions of the spectrum. Additionally, generally more elaborate molecules are required to absorb longer wavelength radiation. This increases the bulk of the photosensitizer. Related to this, reduced thermal and storage stability have been a point of concern.

It is generally accepted that photosensitizer coinitiators function by photon absorption to lift an electron from an occupied molecular orbital to a higher energy, unoccupied orbital. The spin of the electron lifted to the higher energy orbital corresponds to that which it exhibited in its original orbital or ground state. Thus, the photosensitizer in its initially formed excited state is in a singlet excited state. The duration of the singlet excited state is limited, typically less than a few nanoseconds. The excited photosensitizer can return from its singlet excited state directly to its original ground state, dissipating the captured photon energy. Alternatively, the singlet excited state photosensitizer in some instances undergoes intersystem crossing, through spin inversion to another excited state, referred to as a triplet state, wherein lifetimes are typically in the microsecond to millisecond range. Since photosensitizer coinitiators which exhibit triplet states remain in an excited state for time periods that are orders of magnitude greater than photosensitizer coinitiators which exhibit only singlet excited states, a much longer time period is available for reaction with the paired activator coinitiator.

Specht and Farid U.K. No. 2,083,832A discloses photopolymerization coinitiators including azinium activators and amino-substituted photosensitizer (e.g., amino-substituted ketocoumarin) coinitiators which exhibit triplet states on excitation. An essentially cumulative disclosure is provided by Research Disclosure, Vol. 200, Dec. 1980, Item 20036. Research Disclosure is published by Kenneth Mason Publications Ltd., Emsworth, Hampshire P010 7DD, England. As illustrated by Specht, Martic, and Farid, "A New Class of Triplet Sensitizers", Tetrahedron, Vol. 38, pp. 1203–1211, 1982, these amino-substituted 3-ketocoumarins exhibit intersystem crossing efficiencies ranging well above 10 percent—e.g., from 0.18 to 0.92 or 18 to 92 percent, measured in polymer. These photosensitizers were chosen for their ability to form triplet states on excitation and generally absorb exposing radiation of shorter wavelengths, the longest wavelength absorption maxima reported being 480 nm.

In concurrently filed, commonly assigned patent application, Ser. No. 933,658, titled NEGATIVE WORKING PHOTORESISTS RESPONSIVE TO SHORTER VISIBLE WAVELENGTHS AND NOVEL COATED ARTICLES, negative working photoresists are disclosed comprised of a film forming component containing ethylenic unsaturation and capable of selective immobilization as a function of ethylenic addition, and activator and photosensitizer coinitiators for ethylenic addition. The activator is an azinium salt, and the photosensitizer is a yellow dye having a reduction potential which in relation to that of the azinium salt activator is at most 0.1 volt more positive, with the further proviso that, when the photosensitizer is a yellow keto dye, it exhibits when excited by imaging radiation an intersystem crossing efficiency to a triplet state of less than 10 percent.

In concurrently filed, commonly assigned patent application, Ser. No. 933,712, titled DYE SENSITIZED PHOTOGRAPHIC IMAGING SYSTEM, a photographic imaging system comprised of an imaging dye or a precursor thereof, a hardenable organic component containing ethylenic unsaturation sites and capable of imagewise modulating mobility of the dye or dye precursor as a function of addition at the sites of ethylenic unsaturation, and coinitiators for ethylenic addition. The coinitiators are comprised of of an azinium salt activator and a photosensitizer which is a dye exhibiting a reduction potential which in relation to that of said azinium salt activator is at most 0.1 volt more positive, with the further proviso that, when the photosensitizer is a yellow keto dye, it exhibits when excited by imaging radiation an intersystem crossing efficiency to a triplet state of less than 10 percent.

In concurrently filed, commonly assigned patent application, Ser. No. 933,657, titled ENHANCED IMAGING COMPOSITION CONTAINING AN AZINIUM ACTIVATOR, an imaging composition is disclosed comprised of an organic component containing ethylenic unsaturation sites and capable of selective hardening by addition at the sites of ethylenic unsaturation, and azinium salt activator, a photosensitizer having a reduction potential which in relation to the reduction potential of the azinium salt activator is at most 0.1 volt more positive, and an image enhancing amount of benzene substituted with an electron donating amino group and one or more groups capable of imparting a net Hammett sigma value electron withdrawing characteristic of at least +0.20 volt to said benzene ring.

SUMMARY OF THE INVENTION

In one aspect this invention is directed to a negative working photoresist responsive to imaging radiation of a wavelength longer than 550 nm comprised of an organic film forming component containing ethylenic unsaturation and capable of selective immobilization by addition at the site of ethylenic unsaturation and coinitiators for ethylenic addition comprised of an azinium salt activator and a photosensitizer which is a dye having its principal absorption peak at a wavelength longer than 550 nm and having a reduction potential which is relation to that of said azinium salt activator is at most 0.1 volt more positive.

In another aspect this invention is directed to an article comprising a substrate and a coating comprised of a negative working photoresist as described above.

The present invention provides negative working photoresists which exhibit highly desirable imaging properties. First, the photoresists are capable of responding efficiently to imaging radiation in the green and/or red, and can exhibit sensitivity extending into the near infrared portion of the spectrum. Second, the photoresists nevertheless exhibit thermal and storage stabilities that compare well with those of photoresists which are responsive to shorter wavelength imaging exposures. By having the capability of responding to longer wavelengths of exposing radiation the photoresists are particularly well suited for imaging masters which rely on differentials in longer wavelength radiation transmission for image definition. The invention particularly lends itself to the formation of multicolor images employing green and red responsive photoresists according to this invention in combination with one or more blue and/or ultraviolet responsive photoresists.

A notable feature of the photoresists of this invention is that they image efficiently with dyes employed as photosensitizers having their principal absorption peak at a wavelength longer than 550 nm (hereinafter referred to as longer wavelength dyes) regardless of the dye class, provided the dye reduction potentials are properly related to that of the azinium salt activator with which they are employed.

A second notable feature is that the longer wavelength dye photosensitizers have been found to be effective even though they exhibit intersystem crossing efficiencies to a triplet state of less than 10 percent. To the limited extent that the art has previously reported photosensitizer coinitiators for azinium activators consideration has been limited to those photosensitizers which exhibit high (greater than 20%) intersystem crossing efficiencies to a triplet state. This selection is based on the reasoning that dye photosensitizers with longer lifetimes above the ground state have a better opportunity to transfer energy to the azinium activator coinitiator.

Of known photosensitizer coinitiators only a few have exhibited radiation absorptions extending into the visible spectrum thereby qualifying them to be considered as dyes—specifically, amino-substituted keto coumarin and ketomethylene (i.e., merocyanine) yellow keto dyes, have all exhibited high intersystem crossing efficiencies to a triplet state. None of these photosensitizers have been longer wavelength dyes. It has now been observed that longer wavelength dyes satisfying specified reduction potentials in relation to the azinium activators with which they are employed are generally useful as photosensitizer coinitiators, regardless of the dye class from which they are chosen and regardless of whether they exhibit high or low intersystem crossing efficiencies to a triplet state. The foregoing recognition opens up a much wider choice of dyes than heretofore have been thought to be useful as photosensitizers with azinium activators for photoimmobilization by initiation of ethylenic addition reactions.

DESCRIPTION OF PREFERRED EMBODMENTS

It has been discovered that negative working photoresists of the type which undergo immobilization by addition reaction at the site of ethylenic unsaturation can be improved in their performance capabilities by the incorporation of an azinium activator and longer wavelength dyes, not heretofore appreciated to be useful as photosensitizer coinitiators. Specifically, it is the recognition of this invention that useful photosensitizers for imparting imaging response at longer wavelengths (550 nm or longer) are longer wavelength dyes selected from any known dye class, provided they exhibit a reduction potential which in relation to that of the azinium activator is at most 0.1 volt more positive.

Longer wavelength dyes satisfying the required reduction potentials can be selected from any of various known dyes having their principal absorption peak at a wavelength longer than 550 nm. Among specifically contemplated dye classes from which longer wavelength dyes can be selected are coumarin (including sulfonocoumarin) dyes, anthracene dyes, acridine dyes, aniline dyes, azo dyes, rhodamine dyes, and polymethine dyes.

Dyes from the various classes noted are in some instances longer wavelength dyes and in some instances dyes having a principal absorption peak below 550 nm. The eye can be relied upon to select longer wavelength dyes, since dyes having a principal absorption peak below 550 nm will appear yellow. Longer wavelength dyes that absorb principally in the 550 to 600 nm region of the spectrum appear magenta while those that absorb principally in the 600 to 700 nm region of the spectrum appear cyan. Longer wavelength dyes with significant absorptions in the 550 to 700 nm region appear blue. To provide an objective standard for selection, the longer wavelength dyes employed in the practice of this invention are those which in all instances exhibit maximum absorption in a photoresist coating at wavelengths of longer than 550 nm.

In one preferred form of the invention the longer wavelength dye photosensitizers are chosen from the polymethine dye class, which includes the cyanines, merocyanines, complex cyanines and merocyanines (i.e., tri-, tetra- and poly-nuclear cyanines and merocyanines), oxonols, hemioxonols, styryls, merostyryls, and streptocyanines.

The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Exemplary of the basic heterocyclic nuclei are those satisfying Formulae 1 and 2.

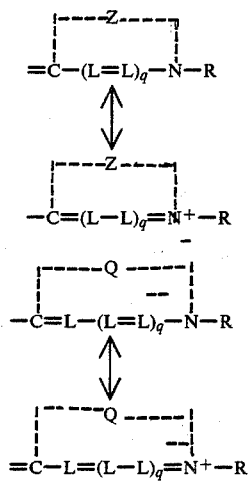

Formula 1

Formula 2 where

Z represents the elements needed to complete a cyclic nucleus derived from basic heterocyclic nitrogen compounds such as oxazoline, oxazole, benzoxazole, the naphthoxazoles (e.g., naphth[2,1-d]oxazole, napth[2,3-d]oxazole, and naphth[1,2-d]oxazole), oxadiazole, thiazoline, thiazole, benzothiazole, the naphthothiazoles (e.g., naphtho[2,1-d]thiazole), the thiazoloquinolines (e.g., thiazolo[4,5-b]quinoline), phenanthrothiazole, acenaphthothiazole, thiadioxazole, selenazoline, selenazole, benzoselenazole, the naphthoselenazoles (e.g., naphtho[1,2-d]selenazole), benzotellurazole, naphthotellurazoles (e.g., naptho[1,2-d]tellurazole), imidazoline, imidazole, benzimidazole, the naphthimidazoles (e.g., naphth[2,3-d]imidazole), 2- or 4-pyridine, 2- or 4-quinoline, 1- or 3-isoquinoline, benzoquinoline, 3H-indole, 1H- or 3H-benzoindole, and pyrazole, which nuclei may be substituted on the ring by one or more of a wide variety of substituents such as hydroxy, the halogens (e.g., fluoro, chloro, bromo, and iodo), alkyl groups or substituted alkyl groups (e.g., methyl, ethyl, propyl, isopropyl, butyl, octyl, dodecyl, octadecyl, 2-hydroxyethyl, 3-sulfopropyl, carboxymethyl, 2-cyanoethyl, and trifluoromethyl), aryl groups or substituted aryl groups (e.g., phenyl, 1-naphthyl, 2-naphthyl, 4-sulfophenyl, 3-carboxyphenyl, and 4-biphenylyl), aralkyl groups (e.g., benzyl and phenethyl), alkoxy groups (e.g., methoxy, ethoxy and isopropoxy), aryloxy groups (e.g., phenoxy and 1-naphthoxy), alkylthio groups (e.g., methylthio and ethylthio), arylthio groups (e.g., phenylthio, p-tolylthio, and 2-naphthylthio), methylenedioxy, cyano, 2-thienyl, styryl, amino or substituted amino groups (e.g., anilino, dimethylamino, diethylamino, and morpholino), acyl groups, (e.g., formyl, acetyl, benzoyl, and benzenesulfonyl);

Q represents the elements needed to complete a cyclic nucleus derived from basic heterocyclic nitrogen compounds such as pyrrole, indole, carbazole, benzindole, pyrazole, indazole, and pyrrolopyridine;

R represents alkyl groups, aryl groups, alkenyl groups, or aralkyl groups, with or without substituents, (e.g., carboxy, hydroxy, sulfo, alkoxy, sulfato, thiosulfato, phosphono, chloro, and bromo substituents);

L is in each occurrence independently selected to represent a substituted or unsubstituted methine group—e.g., $-CR^1=$ groups, where $R^1$ represents hydrogen when the methine group is unsubstituted and most commonly represents alkyl of from 1 to 4 carbon atoms or phenyl when the methine group is substituted; and q is 0 or 1.

Cyanine dyes can contain two heterocyclic nuclei of the type shown in Formula 1 joined by a methine linkage containing an uneven number of methine groups or can contain a heterocyclic nucleus according to each of Formulae 1 and 2 joined by a methine linkage containing an even number of methine groups, where the methine groups can take the form $-CR^1=$ as described above. The greater the number of the methine groups linking nuclei in the polymethine dyes in general and the cyanine dyes in particular the longer the absorption wavelengths of the dyes. For example, dicarbocyanine dyes (cyanine dyes containing five methine groups linking two basic heterocyclic nuclei) exhibit longer absorption wavelengths than carbocyanine dyes (cyanine dyes containing three methine groups linking two basic heterocyclic nuclei) which in turn exhibit longer absorption wavelengths than simple cyanine dyes (cyanine dyes containing a single methine group linking two basic heterocyclic nuclei). Carbocyanine and dicarbocyanine dyes are longer wavelength dyes while simple cyanine dyes are typically yellow dyes, but can exhibit absorption maxima up to about 550 nm in wavelength with proper choice of nuclei and other components capable of bathochromically shifting absorption.

One of the techniques for bathochromically shifting the absorption maxima of polymethine dyes in general and cyanine dyes in particular is to include in the methine linkage an oxocarbon bridging nucleus. Exemplary oxocarbon bridging nuclei can take any of the forms indicated by Formula 3.

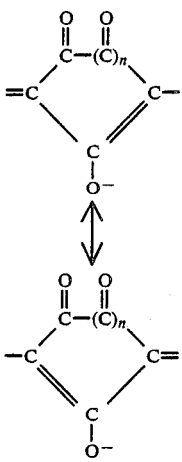

Formula 3 wherein n is the integer 0, 1, or 2.

Merocyanine dyes link one of the cyanine dye type basic heterocyclic nuclei described above to an acidic keto methylene nucleus through a methine linkage as described above, but containing zero, two, or a higher even number of methine groups. Zero methine dyes, those containing no methine groups in the linkage between nuclei, exhibit a double bond linkage between the nuclei in one resonance form and a single bound linkage in another resonance form. In either resonance form the linkage sites in the nuclei are formed by methine groups forming a part of each nucleus. Zero methine polymethine dyes are yellow dyes.

Exemplary acidic nuclei are those which satisfy Formula 4.

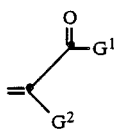

Formula 4 where $G^1$ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;

$G^2$ can represent any one of the groups listed for $G^1$ and in addition can represent a cyano group, an alkyl, or arylsulfonyl group, or a group represented by

or $G^2$ taken together with $G^1$ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

Useful hemicyanine dyes are essentially similar to the merocyanine dyes described above, differing only in substituting for the keto methylene group of Formula 4 the group shown below in Formula 5.

Formula 5 where $G^3$ and $G^4$ may be the same or different and may represent alkyl, substituted alkyl, aryl, substituted aryl, or aralkyl, as illustrated for ring substituents in Formula 1 or $G^3$ and $G^4$ taken together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

Useful hemioxonol dyes exhibit a keto methylene nucleus as shown in Formula 4 and a nucleus as shown in Formula 5 joined by a methine linkage as previously described containing one or a higher uneven number of methine groups.

Useful merostyryl dyes exhibit a keto methylene nucleus as shown in Formula 4 and a nucleus as shown in Formula 6 joined by a methine linkage as described above containing one or a higher uneven number of methine groups.

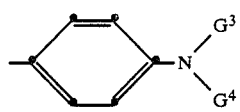

Formula 6 where $G^3$ and $G^4$ are as previously defined.

The longer wavelength cyanine, merocyanine, hemicyanine, hemioxonol, and merostyryl dyes described above are intended to be illustrative of the simpler structural forms of useful longer wavelength polymethine dyes. It is generally recognized that substituents can join the nuclei and methine linkages to form additional cyclic structures. Further, the dyes can contain three or more nuclei. For example, by substituting a merocyanine dye in methine linkage with a second basic heterocyclic nucleus of the cyanine dye type an allopolar cyanine dye can be formed. Further, the various substituents not forming a part of the dye chromophore can be varied as desired to tailor dye physical properties, particularly hydrophobicity and hydrophillicity, to suit the particular film forming components employed. By choosing as the aliphatic moieties of the dyes hydrocarbon groups having more carbon atoms (e.g., from about 6 to 20 carbon atoms) the dyes can be rendered more oleophilic while hydrocarbon groups containing fewer numbers of carbon atoms (e.g., 1 to 5 carbon atoms) and particularly those bearing polar substituents render the dyes more hydrophilic. The aromatic moieties of the dyes typically contain from 6 to 10 carbon atoms.

In addition to being a longer wavelength dye as previously defined, to be useful as a photosensitizer in the present invention the dye must exhibit a reduction potential which is at most 0.1 volt more positive than the reduction potential of the azinium salt activator with which it is employed. Electron transfer from the photosensitizer to the activator is efficiently achieved when the reduction potential of the longer wavelength dye is more negative than that of the photoactivator. In addition, when the reduction potentials of the photosensitizer and activator are equal, energy transfer can still occur. Further, effective performance has been observed when the reduction potential of the photosensitizer is more positive than that of the activator to a limited degree.

In order then to select suitable longer wavelength dyes for the practice of the invention it is necessary to compare the reduction potentials of the azinium activator to be employed and the longer wavelength dye. In the overwhelming majority of instances precise determinations of reduction potentials are not required to ascertain that the proper relationship of reduction potentials exists. In those few instances in which the reduction potential of the dye is sufficiently positive with respect to that of the activator that a precise determination of reduction potentials is desired, it must be taken into account that reduction potentials can vary as a function of the manner in which they are measured. To provide a specific standard for reduction potential determinations, the procedure is employed described by J. Lenhard, "Measurement of Reversible Electrode Potentials for Cyanine Dyes by the Use of Phase-Selective Second Harmonic AC Voltammetry" Journal of Imaging Science, Vol. 30, No. 1, January/February 1986.

In addition to being directed to the use of longer wavelength dyes satisfying the reduction potential relationship set forth above this invention contemplates the use of those longer wavelength keto dyes which exhibit a low intersystem crossing efficiency to a triplet state. Specifically, this intersystem crossing efficiency should be less than 10 percent. Stated another way, it is the recognition of the present invention that longer wavelength dyes having limited excited state lifetimes are nevertheless efficient photosensitizers.

To provide the best possible correlation to the conditions of actual use, the intersystem crossing efficiencies are measured in the photoresist rather than in solution. The measurement of intersystem crossing efficiencies to a triplet state are generally known and reported in the art and form no part of this invention. Techniques for measurement of this parameter are well known in the art, as illustrated by Specht, Martic, and Farid, "A New Class of Triplet Sensitizers", *Tetrahedron*, Vol. 38, pp. 1203-1211, 1982, and the references therein cited.

Known azinium activators can be employed in the practice of this invention. The azinium activators disclosed by Jenkins et al U.S. Pat. Nos. Re. 27,922 and Re. 27,925, Specht and Farid U.K. No. 2,083,832A, and *Research Disclosure*, Vol. 200, December 1980, Item 20036, each cited above, provide a variety of examples of useful azinium activators.

The azinium activators include an azinium nucleus, such as a pyridinium, diazinium, or triazinium nucleus. The azinium nucleus can include one or more aromatic rings, typically carbocyclic aromatic rings, fused with an azinium ring. In other words, the azinium nuclei include quinolinium, isoquinolinium, benzodiazinium, and naphthodiazonium nuclei. To achieve the highest attainable activation efficiencies per unit of weight it is preferred to employ monocyclic azinium nuclei.

A quaternizing substituent of a nitrogen atom in the azinium ring is capable of being released as a free radical upon electron transfer from the photosensitizer to the azinium activator. In one preferred form the quaternizing substituent is an oxy substituent. The oxy substituent (—O—R) which quaternizes a ring nitrogen atom of the azinium nucleus can be selected from among a variety of synthetically convenient oxy substituents. The moiety R can, for example, be an alkyl radical, such as methyl, ethyl, butyl, etc. The alkyl radical can be substituted. For example, arakyl (e.g. benzyl and phenethyl) and sulfoalkyl (e.g., sulfomethyl) radicals are contemplated. In another form R can be an acyl radical, such as an —C(O)—$R^1$ radical, where $R^1$ can take any of the varied forms of alkyl and aralkyl radicals described above. In addition $R^1$ can be an aryl radical, such as phenyl or naphthyl. The aryl radical can in turn be substituted. For example, $R^1$ can be a tolyl or xylyl radical. R typically contains from 1 to 18 carbon atoms, with alkyl moieties in each instance above preferably containing from 1 to 8 carbon atoms and aryl moieties in each instance above containing 6 to 10 carbon atoms. Highest activity levels have been realized when the oxy substituent (—O—R) contains 1 or 2 carbon atoms.

The azinium nuclei need include no substituent other than the quaternizing substituent. However, the presence of other substituents is not detrimental to the activity of the activators. While it is known to include azinium nuclei substituents to increase blue light absorption by the activator directly, substituents capable of performing this function are not required.

It is a specific advantage of this invention that the longer wavelength dye photosensitizer can be relied upon for the absorption of light, and the azinium nuclei, apart from the quaternizing substituent, can be unsubstituted or, preferably, substituted with comparatively simple groups chosen for properties such as ease of synthetic or physical handling convenience, such as groups chosen from among substituted and unsubstituted aryl substituents of from 6 to 10 carbon atoms (e.g., phenyl or naphthyl) and substituted and unsubstituted alkyl and alkenyl groups of from 1 to 18 carbon atoms, preferably of from 1 to 8 carbon atoms. Activators free of a dye chromophore and therefore having limited ability to absorb visible light offer the advantage of improved stability when exposed to light during synthesis and/or handling. For example, these activators remain stable when synthesized and handled in unfiltered room light.

To the extent that substituents other than the quaternizing nitrogen atom substituent are present in the azinium salts employed, it is preferred that these substituents be electron withdrawing or neutral. When substituents other than the quaternizing nitrogen atom substituent are present which are electron donating, the effect is to shift the reduction potential of the activator to a more negative value. Since the photosensitizer has a reduction which in relation to that of the azinium salt activator is at most 0.1 volt more positive, it is apparent that electron donating substituents have the effect of limiting the selection of dyes which can be employed in combination as useful photosensitizers. However, there remain many dyes having sufficiently negative reduction potentials to be useful as photosensitizers in combination with azinium activators having electron donating substituents. Thus, a wide choice of substituents for the azinium salts employed in the present invention are possible. Subject to the considerations indicated above, suitable azinium ring substituents can be illustrated by any one or combination of the various substituents listed for the anilines described below.

Any convenient charge balancing counter-ion can be employed to complete the activator. Both weakly and highly dissociated counter-ions have been demonstrated to be useful. The counter-ion can be chosen for compatibility with the remaining components of the imaging system. For example, fluorinated carboxylate counterions, particularly perfluorinated carboxylate counterions, which are relatively undissociated, have been advantageously employed with azinium activators incorporated in oleophilic media, more specifically described below. Nevertheless, it is believed that highest levels of activity can be attributed to azinium activators which are ionically dissociated from charge balancing counterions in the imaging composition. While variances in ionic dissociation can be achieved by varied choices of solvents, film forming components, acidity, etc., in general higher levels of counter-ion dissociation occur with more electronegative counter-ions, such as hexafluorophosphate, tetrafluoroborate, perchlorate, para-toluenesulfonate, halide, sulfate, and similar electronegative anions.

In addition to activator and photosensitizer coinitiators it is additionally recognized that a third coinitiator, referred to as an enhancer, can optionally be included in the photoresist composition. As is the subject of concurrently filed, commonly assigned U.S. Ser. No. 933,657, titled ENHANCED IMAGING COMPOSITION CONTAINING AN AZINIUM ACTIVATOR, it has been discovered that the imaging response of the photoresist composition can be further improved by including as an enhancer coinitiator an aniline which is ring substituted with one or more groups capable of imparting a net Hammett sigma value derived electron withdrawing characteristic of at least +0.20 to the benzene ring. A positive Hammett sigma value is indicative of a substituent which is capable of rendering a phenyl ring electron withdrawing while a negative Hammett sigma value is indicative of a substituent which is capable of rendering a phenyl ring electron donating. Hydrogen is assigned a Hammett sigma value of zero. Lange's Handbook of Chemistry, 12th Ed., McGraw-Hill, 1979, Table 3–12, pp. 3-135 to 3-138, lists Hammett sigma values for a large number of commonly encountered substituents. By algebraically summing the Hammett sigma values of the various ring substituents of the aniline (that is, the ring substituents other than the one required amine substituent) the net Hammett value derived electron withdrawing characteristic of the ring substituents can be determined.

It is to be noted that the amine substituent forming the aniline is an electron donating substituent. For example, the Hammett sigma values of a primary amine group (—$NH_2$); secondary amine groups, such as alkylamino (e.g., —$NHCH_3$, —$NHCH_2CH_3$, and —NH—n—$C_4H_9$); and tertiary amine groups, such as dialkylamino (e.g., —$NCH_3$) range from −0.04 to −0.83, but are generally more negative than −0.20. While it is not intended to be bound by any particular theory to account for the increased effectiveness imparted by the aniline initiator enhancers, it is believed that the molecular polarization created by the presence of both electron donating and electron withdrawing groups attached to the phenyl ring of the aniline can play a role in the observed increase in initiation activity.

In a preferred form the aniline contains a single ring substituent exhibiting a Hammett sigma value of greater than +0.20. The following illustrative substituents, with meta position Hammett sigma values shown parenthetically, are illustrative of useful electron withdrawing substituents which can be employed as the sole aniline ring substituent: cyano ($\sigma = +0.61$), alkylcarbonyl substituents (e.g., acetyl $\sigma = +0.38$ and trifluoroacetyl $\sigma = +0.65$), arylcarbonyl substituents (e.g., phenylcarbonyl $\sigma = +0.34$), oxycarbonyl substituents, including alkoxycarbonyl and aryloxycarbonyl substituents (e.g., methoxycarbonyl $\sigma = +0.32$, ethoxycarbonyl $\sigma = +0.37$), nitro ($\sigma = +0.71$), thiocyanato ($\sigma = +0.63$), perhaloalkyl substituents (e.g., trichloromethyl $\sigma = +0.47$ and trifluoromethyl $\sigma = +0.47$), perfluoroalkylthio substituents (e.g., trifluoromethylthio $\sigma = +0.35$), sulfamoyl substituents, including alkylsulfamoyl and arylsulfamoyl substituents (e.g., sulfamoyl $\sigma = +0.46$), carbonylthio substituents (e.g., acetylthio $\sigma = +0.39$), carbamoylthio substituents (e.g., carbamoylthio $\sigma = +0.34$), oxythio substituents, including alkoxythio and aryloxythio substituents (e.g., methoxythio $\sigma = +0.52$), and sulfonyl substituents, including alkylsulfonyl and arylsulfonyl substituents (e.g., methylsulfonyl $\sigma = +0.68$ and phenylsulfonyl $\sigma = +0.67$). Multiple ring substitutions with these substituents are contemplated.

In addition to the highly electron withdrawing substituents identified above the aniline ring can, but need not, include ring substituents having Hammett sigma value derived electron withdrawing characteristics less positive than +0.20, provided a net Hammett sigma value derived electron withdrawing characteristic of at least +0.20 is maintained. Exemplary simple substituents and their published meta Hammett sigma values are primary and second alkyl substituents, such as methyl $\sigma = -0.07$, ethyl $\sigma = -0.07$, n-propyl $\sigma = -0.05$, i-propyl $\sigma = -0.07$, n-butyl $\sigma = -0.07$, and sec-butyl $\sigma = -0.07$. These alkyl substituents are synthetically convenient and therefore contemplated, though electron donating. Alkyl substituents containing tertiary carbon atoms and particularly tertiary alkyl groups tend to be even more highly electron donating and are not preferred. Aryl groups such as phenyl, $\alpha$-naphthyl, and $\beta$-naphthyl groups are contemplated (e.g., phenyl $\sigma = +0.06$). Other useful and specifically contemplated hydrocarbon substituents include alkaryl substituents (e.g., p-methylphenyl), aralkyl substituents (e.g., benzyl $\sigma = -0.05$ and phenethyl), alkenyl substituents (e.g. vinyl $\sigma = +0.02$), aralkenyl substituents (e.g., 2-phenylvinyl $\sigma = +0.14$), alkynyl substituents (e.g., ethynyl $\sigma = +0.21$, propargyl, and 2-butynyl), and aralkynyl substituents (e.g., phenethynyl $\sigma = +0.14$). Substituted hydrocarbon substituents are also contemplated, such as haloalkyl substituents (e.g., bromomethyl, chloromethyl $\sigma = -0.12$, fluoromethyl, and iodomethyl), haloaryl substituents (e.g., p-bromophenyl, m-bromophenyl, and p-chlorophenyl, and hydroxyalkyl substituents (e.g., hydroxymethyl $\sigma = +0.08$). Oxy substituents or substituent moieties of hydrocarbon substituents are specifically contemplated—i.e., hydroxy ($\sigma = +0.10$), alkoxy (e.g., methoxy $\sigma = +0.14$, ethoxy $\sigma = +0.07$, n-propoxy $\sigma=+0.07$, i-propoxy $\sigma=0.00$, n-butoxy $\sigma=-0.05$, cyclohexoxy $\sigma=+0.29$, cyclohexylmethoxy $\sigma=+0.18$, and trifluoromethoxy $\sigma=+0.36$), and aryloxy (e.g., phenoxy $\sigma=+0.25$). Halogen substituents are contemplated—i.e., bromo ($\sigma=+0.39$), chloro ($\sigma=+0.35$), fluoro ($\sigma=+0.34$), and iodo ($\sigma=+0.35$). Amido substituents are also contemplated, such as amido ($\sigma=+0.25$), methylamido ($\sigma=+0.21$), phenylamido ($\sigma=+0.22$), and ureido ($\sigma=+0.18$).

When electron donating or weakly electron withdrawing substituents are employed, they are in every instance employed in combination so that the net Hammett sigma derived value of the various substituents other than the one required amino substituent forming the aniline is greater than +0.20. While meta position Hammett sigma values have been provided, in most instances para position Hammett sigma values are not highly different and can, in any event, be determined by reference to published lists. Ortho Hammett sigma values are usually essentially identical to para position Hammett sigma values. Meta, ortho, and para positions for the various substituents to the aniline are assigned with reference to the position of the amino group forming the aniline. To minimize molecular bulk it is generally preferred that the aliphatic moieties of the various ring substituents each contain 6 or fewer carbon atoms and that the aromatic moieties each contain 10 or fewer carbon atoms.

The organic film forming component of the negative-working photoresist to be acted upon by the coinitiators can take the form of any conventional negative-working photoresist organic film forming component containing ethylenic unsaturation and capable of selective immobilization by undergoing an addition reaction at the site of the ethylenic unsaturation. Immobilization can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Pat. Nos. Re. 27,925 or Re. 27,922, or respectively, are suitable for use in the photoresists of this invention and are here incorporated by reference. Tan et al U.S. Pat. No. 4,289,842, here incorporated by reference, discloses negative working photoresists containing light sensitive acrylate copolymers containing pendant groups, such as alkenyl group with ethylenic unsaturation. Lindley U.S. Pat. No. 4,590,147, here incorporated bby reference, discloses vinyl oligomers which can be employed as film forming components in the photoresists of this invention. Useful film forming components containing vinyl monomers are disclosed in Fuerniss U.S. Pat. No. 4,497,889 and Anderson et al U.S. Pat. No. 4,535,052, both here incorporated by reference. Kosar *Light-Sensitive Systems*, John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polymeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Chang U.S. Pat. No. 3,756,827, here incorporated by reference, discloses in column 2, line 36 to column 3, line 30, a variety of suitable organic monomers for use in the photoresists of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation, such as polymerized forms of any of the various ethylenically unsaturated monomers which can be incorporated in the photoresists, such as polyalkylenes—e.g. polyethylene and polypropylene; poly(vinyl alcohol); poly(vinyl esters)—e.g., poly(vinyl acetate); polystyrene; poly(acrylic and methacrylic acids and esters)—e.g., poly(methyl methacrylate) and poly(ethyl acrylate), as well as copolymer variants.

The foregoing is, of course, only an illustrative listing of the most commonly encountered film forming components. Other specific illustrative film forming components are included in the examples.

In addition to the film forming component and the coinitiators the photoresists can contain any one or combination of known addenda, such as thermal inhibitors, colorants, plasticizers, fillers, etc. To facilitate coating on a substrate the film forming component, coinitiators, and addenda, if any, are usually dispersed in a solvent to create a solution or slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dichloroethane; aromatic hydrocarbons, such as benzene and toluene; and other common solvents, such as dimethyl sulfoxide, chlorobenzene, and various mixtures of solvents.

The substrate onto which the photoresist is coated can take any convenient conventional form. For example, the photoresist can be used to define a pattern during fabrication of an electronic component. In this instance the substrate can take the form of a printed circuit board or semiconductor chip, typically one which has been only partially fabricated to a completed form.

In other instances photoresists can be coated on simple unitary substrates, such as glass, ceramic, metal, cellulose paper, fiberboard, or polymer substrates. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulose acetate film, heavy paper, such as lithographic paper, and the like. Another specifically contemplated use of the photoresists of this invention is as a planarizing layer, such as a planarizing layer on a semiconductor chip or on an optical disc.

In perhaps their most commonly used form photoresists are coated in a fluid form on a substrate and evaporatively dried, usually with heating, to produce a uniform coating. Often, particularly in the manufacture of semiconductor devices, the substrate is spun, thereby employing centrifugal forces to assure the uniformity of the photoresist coating before drying. After exposure to actinic radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the developer to achieve selective removal. In its simplest form the liquid developer can be the same liquid employed as a solvent in coating the photoresist. Methoxyethyl acetate and ethoxyethyl acetated are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derived from glycols, such as dihydroxy poly(alkylene oxides). Lactone developers, such as those disclosed by Martinson et al U.S. Pat. No. 3,707,373, can be employed. Optimum developer choices for specific photoresists are disclosed in the various patents cited above illustrating the specific film forming components.

In forming planarizing layers the photoresist is spun after coating. The centrifugal forces level or at least reduce the relief of the surface of the coating. For optical disc planarizing layers highly smooth and defect free surfaces are required. For semiconductor manufacture planarizing layers are generally relied upon merely to reduce the surface relief. In either case, there is uniform exposure to actinic radiation, at least in the areas where the planarizing layer is desired. Where the entire photoresist coating is exposed to actinic radiation, there is, of course, no need for development, since there is no removal of the coating.

In still another manner of use, a photoresist layer is coated on a support and overcoated with a strippable cover sheet. The end user typically purchases the photoresist as an article rather than a liquid composition. After removing the cover sheet, the photoresist layer together with its support is laminated to the substrate on which the image pattern is desired. Following patterned exposure to actinic radiation through the support, the support is stripped from the substrate leaving photoresist on the substrate in an imagewise pattern.

In still another manner of use the photoresist is coated on a support surface modified to facilitate electroless metal deposition. Again, a strippable cover sheet is located on the photoresist coating. In this use imagewise exposure to actinic radiation occurs through the cover sheet followed by stripping. Upon stripping of the cover sheet there is selective removal of the photoresist so that remaining photoresist defines the desired pattern. Electroless metal plating can then be undertaken to convert the support into an article having a metal pattern thereon. A common application is in the formation of electrical circuits.

The common feature of all of these applications is that the film forming component of the photoresist with the coinitiators present forms a coating which is then exposed to actinic radiation. The actinic radiation that is employed with the photoresist of this invention is electromagnetic radiation including wavelengths in at least one of the green and red regions of the spectrum. By employing longer wavelength dyes as photosensitizers the photoresists are rendered highly sensitive to these visible wavelengths. By employing visible light for exposures visual corroboration of exposure is possible. Further, source elements for visible light exposures offer construction advantages over the conventionally employed ultraviolet exposure sources.

Any conventional ratio of activator to film forming component can be present in the photoresists of this invention. Activator concentrations are as a practical matter most conveniently specified in terms of moles of activator per gram of dry solids, the latter consisting of the film forming component and the minor amounts of various addenda, but excluding any liquid component introduced to facilitate coating. Typically from about $2 \times 10^{-5}$ to $25 \times 10^{-5}$, most preferably from about $5 \times 10^{-5}$ to $20 \times 10^{-5}$ mole of activator is present per gram of dry solids.

In the practice of the present invention the enhancer is an optional coinitiator, meaning that it need not be present or need not be present in an effective amount. However, it is generally preferred to incorporate the enhancer in any convenient effective amount. Typically from about 0.1 to 10 moles per mole of activator are employed. The use of larger amounts is, of course, possible.

The photosensitizer can be present in any concentration capable of increasing the response of the photoresist to light. While the photosensitizer concentration can vary widely, it is generally contemplated to employ photosensitizer in concentrations ranging from about $5 \times 10^{-7}$ to $1 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

EXAMPLES

The invention can be better appreciated by reference to the following specific examples.

EXAMPLES 1 THROUGH 54

A series of negative working photoresist compositions PR-1 each containing 0.02 millimole of a different dye being tested as a photosensitizer were prepared.

PR-1 was formulated as follows:

2.34 g Binder A
1.17 g Monomer A
1.17 g Monomer B
0.012 g Inhibitor A
0.077 g Activator A
0.02 mmol Photosensitizer
10.32 g Solvent (Dichloromethane)

Binder A exhibited the following structure

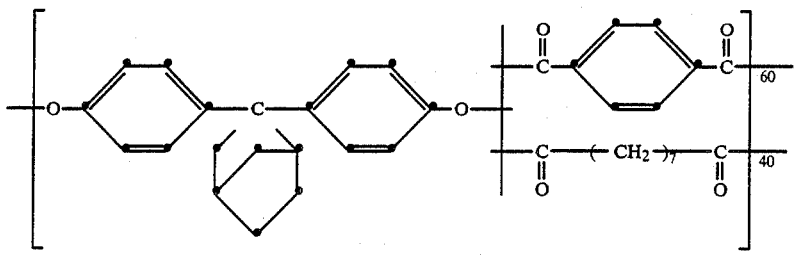

Monomer A exhibited the following structure

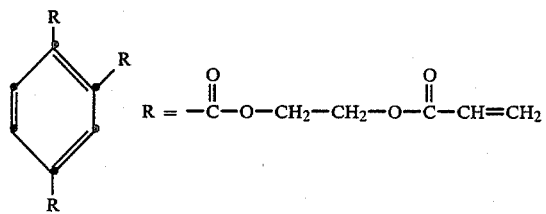

Monomer B exhibited the following structure

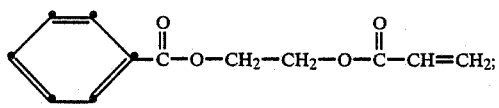

Inhibitor A exhibited the following structure

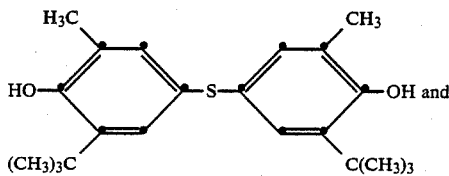

Activator A was 1-methoxy-4-phenylpyridinium tetrafluoroborate.

Each of the photoresist compositions was coated on a copper sheet using a 0.3 mm coating knife and dried for 10 minutes at about 70° C. A transparent polypropylene cover sheet was then placed over the coating.

Since PR-1 without the photosensitizer coinitiator responds to ultraviolet exposures, shorter wavelengths were removed during exposure using filters. Specifically, wavelengths below the absorption peak of the photosensitizer dye were removed using a W-2A, W-16, or W-25 Wratten ® filter capable of filtering 99.9 percent of radiation of less than 400, 510, or 580 nm in wavelength, respectively.

To determine the degree of effectiveness of the photosensitizer exposure of each coated sample was undertaken through a Kodak T-14 ® step tablet having 14 equal increment density steps ranging in density from essentially zero to 2.1. Three minute exposures were undertaken using a Nu-arc FT32L ® flip-top platemaker equipped with a 4000 watt pulsed Xenon lamp. After exposure the samples were baked for 10 minutes at 70° C. and spray developed for two minutes. Development was undertaken using 1,1,1-trichloroethane as a developer. Response was measured in terms of the number of stepped exposure areas (steps) in which the photoresist was retained following exposure. For example, a photoresist sample which was retained following exposure and development on 10 steps, but was absent from the remaining four steps was assigned a step rating of 10. If partial retention of the photoresist was observed on the eleventh step, this was indicated by assigning a plus rating—i.e., 10+. On the other hand, where the photoresist retention was deemed just barely adequate to merit the step rating, this was indicated by assigning a minus rating—i.e., 10—.

Results with the various dyes are indicated below in Table I, which reports the absorption peak of the dye in the coating and the step range of response. Activator A exhibited a reduction potential of $-0.75$ volts, and each of the dye photosensitizers exhibited a reduction potential less than 0.1 volt more positive than the reduction potential of Activator A.

When control formulations of PR-1 were prepared varied only by omitting Activator A, so that the dye was the sole initiator present, little or no imaging response was observed. This showed the dye photosensitizers to be relatively ineffective when employed as the sole initiators.

When control formulations of PR-1 were preparing varied only by omitting the dye, so that Activator A was the sole initiator present, performance of the procedure described above and including the filtering used with the dyes resulted in no imaging response being observed. This showed the activator to be ineffective to impart sensitivity to the photoresist in the blue portion of the spectrum.

The dyes employed as photosensitizers, their reduction potentials, and the number of steps of retained photoresist after development are shown in Table I. In every instance the keto dyes listed in Table I exhibit an intersystem crossing efficiency to a triplet state of less than 10 percent.

TABLE I

|  | n | R | X⁻ | g-max | $E_{red}$ | Steps |
|---|---|---|---|---|---|---|
| PS-1 | 1 | — | I⁻ | 555 | −1.00 | 6 |
| PS-2 | 2 | — | I⁻ | 650 | −0.82 | 4 |
| PS-3 | 3 | — | I⁻ | 750 | −0.67 | 1 |
| PS-4 | 3 | (CH=CH)₂ | ClO₄⁻ | 791 | −0.68 | 1 |

|  | λ-max | $E_{red}$ | Steps |
|---|---|---|---|
| PS-5** | 600 | −0.49 | 0 |

|  | λ-max | $E_{red}$ | Steps |
|---|---|---|---|
| PS-6 | 567 | — | 9⁻ |
| PS-7 | 572 | −1.35 | 11 |

|  | R¹ | R² | R³ | X⁻ | λ-max | $E_{red}$ | Steps |
|---|---|---|---|---|---|---|---|
| PS-8 | —C₄H₉ | —H | — | I⁻ | 573 | −1.06 | 8⁺* |
| PS-9 | —C₁₈H₃₇ | —H | — | PTS⁻ | 574 | −1.06 | 7⁻ |
| PS-10 | —C₄H₉ | —CH₃ | — | I⁻ | 560 | −1.10 | 10⁻* |
| PS-11 | —C₅H₁₁ | —CH₃ | — | I⁻ | 560 | −1.10 | 8⁺* |
| PS-12 | -i-C₃H₇ | —CH₃ | — | I⁻ | 566 | −1.10 | 9⁻* |
| PS-13 | —C₃H₇ | —C₂H₅ | — | I⁻ | 562 | −1.11 | 9⁺* |
| PS-14 | —C₂H₅ | —C₂H₅ | — | C₃F₇COO⁻ | 563 | −1.11 | 10* |
| PS-15 | —C₂H₅ | —C₆H₁₁ (cyclohexyl) | (CH=CH)₂ | I⁻ | 590 | ca −1.10 | 8* |
| PS-16 | C₂H₅ | —C₁₅H₃₁ | (CH=CH)₂ | I⁻ | 592 | ca −1.10 | 9⁺* |

TABLE I-continued

| | R¹ | R² | R³ | R⁴ | R⁵ | R⁶ | X⁻ | λ-max | E_red | Steps |
|---|---|---|---|---|---|---|---|---|---|---|
| PS-17 | —CH₂CH₃ | H | H | H | H | H | I⁻ | 670 | −0.89 | 6* |
| PS-18 | —CH₂CH₃ | H | H | H | H | —OCH₃ | PTS⁻ | 684 | | 8 |
| PS-19 | —CH₂CH₃ | H | H | H | —CH₃ | H | ClO₄⁻ | 666 | −0.93 | 7 |
| PS-20 | —CH₂CH₃ | H | —CH₂—C(CH₃)₂—CH₂— | | H | H | ClO₄⁻ | 663 | −0.98 | 9 |
| PS-21 | —CH₂CH₂CH₂— | | H | H | H | H | PTS⁻ | 685 | −0.99 | 8 |
| PS-22 | —CH₂—CH₂— | | —CH₂—C(CH₃)₂—CH₂— | | H | H | PTS⁻ | 685 | −1.09 | 10 |

| | | λ-max | E_red | Steps |
|---|---|---|---|---|
| PS-23 | [structure] I⁻ | 705 | | 6 |
| PS-24 | [structure] I⁻ | 782 | −0.74 | 3 |
| PS-25 | [structure] ClO₄⁻ | 834 | | 1+ |
| PS-26 | [structure] I⁻ | 595 | −1.05 | 9−* |
| PS-27 | [structure] I⁻ | 702 | −0.87 | 4+* |

TABLE I-continued

| | R | X⁻ | λ-max | $E_{red}$ | Steps |
|---|---|---|---|---|---|
| PS-28 | —CH₂CH₂C₆H₅ | Br⁻ | 622 | −1.04 | 6 |
| PS-29 | —CH₂CH₃ | Cl⁻ | 621 | −1.04 | ca. 6 |

| | λ-max | $E_{red}$ | Steps |
|---|---|---|---|
| PS-30 | 725 | | 4⁻ |
| PS-31 | 655 | | 4 |
| PS-32 | 566 | | 4 |
| PS-33 | 722 | −0.86 | 6 |
| PS-34 | 578 (broad) | −0.75 | Ca. 5 |

TABLE I-continued
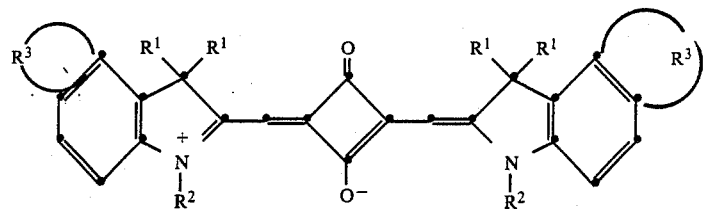
|        | R¹    | R²    | R³              | λ-max | $E_{red}$ | Steps  |
|--------|-------|-------|-----------------|-------|-----------|--------|
| PS-35  | —CH₃  | —CH₃  | —               | 642   | −1.15     | 9–10   |
| PS-36  | —CH₃  | —CH₃  | $-(CH=CH)_2-$   | 673   | −1.08     | 9–10*  |
| PS-37  | —CH₃  | —C₆H₅ | —               | 652   | −0.98     | 9–10*  |
| PS-38  | —CH₃  | —CH₂—C₆H₄—C₂H₅ | —  | 649   | −1.07     | 10*    |
| PS-39  | 2 adjacent R¹ = $-(CH_2)_5-$ i.e., spirocyclohexyl | | | 652 | −1.15 | 10* |
| PS-40  |       |       |                 | 610   | −1.05     | 9–10*  |
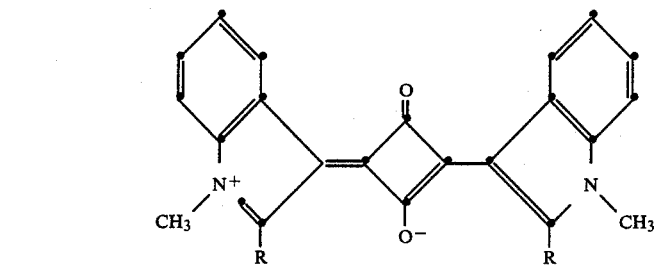
|       | λ-max | $E_{red}$ | Steps |
|-------|-------|-----------|-------|
| PS-41 | R = C₆H₅ | 605 | −0.93 | 7+ |
| PS-42 | R = —C₁₀H₇, i.e. α-naphthyl | 604 | −0.88 | 7 |
| PS-43 | | 648 | −0.99 | 6 |
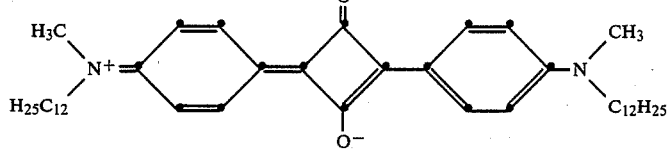
| | λ-max | $E_{red}$ | Steps |
|---|---|---|---|
| PS-44 | 675 | −0.92 | 9 |

TABLE I-continued

| | | λ-max | E_red | Steps |
|---|---|---|---|---|
| PS-45 | (structure: squarylium dye with ethyl/methyl pyrrolinium groups) | 573 | −1.01 | 9 |

(Triarylmethane/xanthene structure with substituents $R^1, R^2, R^3, R^4, R^5, R^6$ and counterion $X^-$)

| | $R^1$ | $R^2$ | $R^3$ | $R^4$ | $R^5$ | $R^6$ | $X^-$ | λ-max | $E_{red}$ | Steps |
|---|---|---|---|---|---|---|---|---|---|---|
| PS-46 | H | —CH$_2$CH$_3$ | —CH$_2$CH$_3$ | H | COOCH$_2$CH$_3$ | H | ClO$_4^-$ | 566 | −0.79 | 2+ |
| PS-47 | | —CH$_2$CH$_2$CH$_2$— | —CH$_2$CH$_2$CH$_2$— | | COO$^-$ | H | — | 587 | −1.11 | 8+* |
| PS-48 | | —CH$_2$CH$_2$CH$_2$— | —CH$_2$CH$_2$CH$_2$— | | SO$_3^-$ | SO$_3$H | — | 592 | −1.01 | 8+* |

| | | λ-max | $E_{red}$ | Steps |
|---|---|---|---|---|
| PS-49 | pyronin Y (structure shown: (CH$_3$)$_2$N-xanthenium-N(CH$_3$)$_2$ Cl$^-$) | 556 | ca −0.8 | 4 |
| PS-50** | oxazine 4 perchlorate (structure shown) | 622 | −0.29 | 0 |
| PS-51** | oxazine 170 perchlorate (structure shown) | 630 | −0.32 | 0 |
| PS-52** | oxazine 1 perchlorate | 658 | −0.33 | 0 |

TABLE I-continued

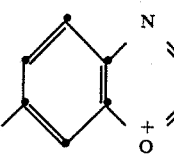

| | n | λ-max | $E_{red}$ | Steps |
|---|---|---|---|---|
| PS-55 | 1 | 553 | −1.2 | 11+* |
| PS-56 | 2 | 656 | −1.0 | 10+* |

**Comparative examples showing inoperability resulting from inappropriate reduction potentials.

EXAMPLES 57 THROUGH 77

Most of the experiments reported in Examples 1 through 56 were repeated, but with the coated samples held for more than 6 months. In comparing performances of fresh coated samples with those stored at room temperature for more than 6 months no variances in the number of steps developed was observed or at most variances of only one step. These observations were made using the dyes represented by the asterisks in Table I.

These examples illustrate the outstanding stability of the imaging compositions and, particularly, the photosensitizer coiniators of this invention.

EXAMPLES 78 THROUGH 96

The procedure of Examples 1 through 56 was repeated, but with a variety of differing azinium activators substituted for Activator A. The photoresist contained photosensitizer PS-14 or PS-37. The results are listed below in Table II. All of the azinium activators were effective. When no azinium activator was present in the photoresist, all of the photoresist was removed on development. In other words, the number of steps was zero.

TABLE II

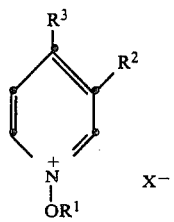

| R¹ | R² | R³ | X⁻ | Steps PS-37 | PS-14 |
|---|---|---|---|---|---|
| CH₃ | H | C₆H₅ | BF₄⁻ | 9+ | 10⁻ |
| CH₃ | H | C₆H₅ | C₃F₇COO⁻ | 6 | 6+ |
| CH₃ | H | COOCH₃ | PF₆⁻ | 5⁻ | 9 |
| CH₃ | H | COOCH₂CH₂C₆H₅ | BF₄⁻ | 5+ | 9⁻ |
| CH₃ | COOCH₃ | H | PF₆⁻ | 8 | 9 |
| CH₃ | COOCH₂CH₂C₆H₅ | H | PF₆⁻ | 8⁻ | 10⁻ |
| CH₃ | COOCH₂CH₂C₆H₅ | H | BF₄⁻ | 10 | 11 |
| CH₃ | COOCH₂CH₂OC₂H₅ | H | BF₄⁻ | 9 | — |
| C₂H₅ | H | C₆H₅ | BF₄⁻ | 7+ | 9 |
| C₄H₉ | H | C₆H₅ | PF₆⁻ | 7+ | 7 |

The invention has been described in detail with particular reference to preferred embodiments thereof, but it will be understood that variations and modifications can be effected within the spirit and scope of the invention.

What is claimed is:

1. A negative working photoresist responsive to imaging radiation of a wavelength longer than 550 nm consisting essentially of
    an organic film forming component chosen from the class consisting of monomers, oligomers, and polymers each containing ethylenic unsaturation and capable of selective immobilization by addition at the site of ethylenic unsaturation and
    coinitiators for ethylenic addition comprised of
        an effective amount of a quaternized azinium salt activator and
        a concentration sufficient to increase response of the photoresist to light of a photosensitizer which is a dye having its principal absorption peak at a wavelength longer than 550 nm and having a reduction potential which in relation to that of said azinium salt activator is at most 0.1 volt more positive.

2. A negative working photoresist according to claim 1 in which said organic film forming component is comprised of at least one addition polymerizable ethylenically unsaturated compound having a boiling point above 100° C. at normal pressure.

3. A negative working photoresist according to claim 2 in which said polymerizable ethylenically unsaturated compound is a monomer.

4. A negative working photoresist according to claim 2 in which said polymerizable ethylenically unsaturated compound is an oligomer.

5. A negative working photoresist according to claim 2 in which said polymerizable ethylenically unsaturated compound is a crosslinkable polymer.

6. A negative working photoresist according to claim 2 in which said organic film forming component additionally includes a binder.

7. A negative working photoresist according to claim 1 in which said photosensitizer exhibits a reduction potential that is more negative than the reduction potential of said azinium activator.

8. A negative working photoresist according to claim 1 in which said photosensitizer is a rhodamine, anthracene, azo, aniline, or acridine dye.

9. A negative working photoresist according to claim 1 in which said photosensitizer is a polymethine dye.

10. A negative working photoresist according to claim 9 in which said photosensitizer is a cyanine, merocyanine, oxonol, hemioxonol, styryl, merostyryl, or streptocyanine dye.

11. A negative working photoresist according to claim 1 in which said photosensitizer is a dye which exhibits an intersystem crossing efficiency to a triplet state of less than 10 percent.

12. An article comprised of a substrate and a negative working photoresist coating consisting essentially of
    an organic film forming component chosen from the class consisting of monomers, oligomers, and polymers each containing ethylenic unsaturation and capable of selective immobilization by addition at the site of ethylenic unsaturation and
    coinitiators for ethylenic addition comprised of
        an effective amount of a quaternized azinium salt activator and
        a concentration sufficient to increase response of the photoresist to light of a photosensitizer which is a dye having its principal absorption peak at a wavelength longer than 550 nm and having a reduction potential which in relation to that of said azinium salt activator is at most 0.1 volt more positive.

13. A negative working photoresist according to claim 1 wherein said photosensitizer is present in a concentration ranging from $5 \times 10^{-7}$ to $1 \times 10^{-4}$ mole per gram of dry solids.

14. A negative working photoresist according to claim 13 where said activator is present in a concentration of from $2 \times 10^{-5}$ to $25 \times 10^{-5}$ mole per gram of dry solids.

15. An article according to claim 12 in which said organic film forming component is comprised of at least one addition polymerizable ethylenically unsaturated compound having a boiling point about 100° C. at normal pressure.

16. An article according to claim 12 in which said photosensitizer exhibits a reduction potential that is more negative than the reduction potential of said azinium activator.

17. An article according to claim 12 in which said photosensitizer in a rhodamine, anthracene, azo, aniline, or acridine dye.

18. An article according to claim 12 in which said photosensitizer is a polymethine dye.

19. An article according to claim 18 in which said polymethine dye is a cyanine, merocyanine, oxonol, hemioxonol, styryl, merostyryl, or stretocyanine dye.

20. An article according to claim 12 in said photosensitizer is a dye which exhibits an intersystem crossing efficiency to a triplet state of less than 10 percent.

21. An article according to claim 12 wherein said photosensitizer is present in a concentration ranging from $10^{-6}$ to $5 \times 10^{-5}$ mole per gram of dry solids.

22. An article according to claim 21 wherein said photosensitizer is present in a concentration ranging from $2 \times 10^{-6}$ to $2 \times 10^{-5}$ mole per gram of dry solids.

23. An article according to claim 21 wherein said activator is present in a concentration of from $5 \times 10^{-5}$ to $20 \times 10^{-5}$ mole per gram of dry solids.

24. A photoresist composition according to claim 1 wherein said azinium salt activator is free of a dye chromophore and is stable in unfiltered room light.

25. An article according to claim 12 wherein said azinium salt activator is free of a dye chromophore and is stable in unfiltered room light.

* * * * *